United States Patent
Ishida et al.

(10) Patent No.: US 7,261,760 B2
(45) Date of Patent: Aug. 28, 2007

(54) MEMBER HAVING SEPARATION STRUCTURE AND METHOD FOR MANUFACTURE THEREOF

(76) Inventors: Kiyohito Ishida, 5-20. Karnisugi 3-chome, Aoba-ku, Sendai-shi, Miyagi, 980-0011 (JP); Ryosuke Kainuma, 72-15, Aza Sekine, Tekurada, Natori-shi, Miyagi, 981-1231 (JP); Ikuo Ohnuma, 146, Aza Machi, Oza Murata, Muratamachi, Shibata-gun, Miyagi, 980-1305 (JP)

( * ) Notice: Subject to any disclaimer, the term of this patent is extended or adjusted under 35 U.S.C. 154(b) by 356 days.

(21) Appl. No.: 10/471,132

(22) PCT Filed: Mar. 5, 2002

(86) PCT No.: PCT/JP02/02028

§ 371 (c)(1),
(2), (4) Date: Sep. 5, 2003

(87) PCT Pub. No.: WO02/070762

PCT Pub. Date: Sep. 12, 2002

(65) Prior Publication Data

US 2004/0108597 A1 Jun. 10, 2004

(30) Foreign Application Priority Data

Mar. 6, 2001 (JP) .............................. 2001-062619
Feb. 8, 2002 (JP) .............................. 2002-031913

(51) Int. Cl.
*C22C 9/00* (2006.01)
(52) U.S. Cl. .................. 75/255; 148/432; 420/499
(58) Field of Classification Search .................. 75/255; 148/432; 420/495, 496, 499
See application file for complete search history.

(56) References Cited

U.S. PATENT DOCUMENTS 2,058,376 A 10/1936 Crichett (Continued)

FOREIGN PATENT DOCUMENTS

| CA | 914951 A | * 11/1972 |
|---|---|---|
| GB | 1 284 994 | 9/1972 |
| GB | 1284994 | * 9/1972 |

OTHER PUBLICATIONS

Zhu, M. : "Microstructure Characteristics of Nanophase Composite Synthesized By Mechanical Alloying of Immiscible Pb-Al and Fe-Cu Systems," *Scripta Materialia*, vol. 36, No. 4, pp. 447-453 (1997).

(Continued)

*Primary Examiner*—George Wyszomierski
(74) *Attorney, Agent, or Firm*—DLA Piper US LLP

(57) ABSTRACT

A member having a separated structure made by an alloy consisting of two regions having different compositions with each other is formed by casting a molten alloy into a prescribed shape, or by spray-quenching the same from a temperature of $Tc+10°$ C. or more, wherein the molten alloy exhibits two phase separation in a liquid state having a temperature difference $\Delta T$ between the maximum temperature Tc (° C.) and minimum temperature Td (° C.) in the region of two phase separation in the liquid state being 10° C. or more, and the molten alloy has a mean composition with a difference of the volume fraction between the two liquid phases of 5% by volume or more. The suitable alloy is a Cu—Fe—X alloy, a Cu—Cr—X alloy, a Cu—Co—X alloy, a Cu—Bi—X alloy, an Al—Sn—X alloy or an Al—In—X alloy. The powder obtained by spray-quenching any one of the molten alloys of the Cu—Bi—X alloy, the Al—Sn—X alloy and the Al—In—X alloy has a separated structure comprising a surface portion having a solder composition and a core portion with a composition mainly comprising Cu and Al being excellent in electrical conductivity and heat conductivity and is suitable as a solder ball.

2 Claims, 11 Drawing Sheets

(a)

(b)

U.S. PATENT DOCUMENTS

| | | | |
|---|---|---|---|
| 3,918,957 A * | 11/1975 | Suzuki et al. | 75/10.25 |
| 4,166,147 A | 8/1979 | Lange et al. | |
| 4,387,276 A * | 6/1983 | Plewes et al. | 381/180 |
| 5,643,679 A * | 7/1997 | Ishimaru et al. | 428/472 |
| 6,783,569 B2 * | 8/2004 | Cheon et al. | 75/348 |
| 7,045,113 B2 * | 5/2006 | Dorfman et al. | 423/593.1 |

OTHER PUBLICATIONS

He, L. et al. "Processing and microhardness of bulk Cu-Fe nanocomposites ." Nanostructured Materials 7, vol. No. 3, pp. 327-339, 1996.

* cited by examiner (a)

(b)

100μm

100μm (a)

(b)

MEMBER HAVING SEPARATION STRUCTURE AND METHOD FOR MANUFACTURE THEREOF

BACKGROUND OF THE INVENTION

1. Technical Field

The invention relates to a member having a separated structure composed of two regions having different compositions with each other, and a method for producing the same. The member as used in the present invention includes a plate, rod, wire, pipe and powder.

2. Description of Background Art

High level and versatile properties are required for metallic materials in accordance with expanded use of the material in a severe environment. In some cases, each part of a material is required to have different property. For complying with such requirements, a surface treatment has been applied to the material, or a clad material or a material having a sandwich structure has been devised on order to meet such requirements. However, since these methods require a complicated process and sophisticated control techniques, it was a problem that the production cost increases.

A functionally gradient material has been also devised in recent years, wherein chemical compositions and structure are changed continuously or stepwise from the inside of the material to the surface thereof. Recently, it has been studied that the material is made to have a gradient of the composition and structure by gradually changing the ratio between a metal and ceramic by using, for example, a centrifugal force, plasma sintering or plasma spraying in order to produce a material comprising a surface layer having a high hardness as well as having highly wear resistant and heat resistant, and an inner layer having high toughness (for example, Bulletin of The Iron and Steel Institute of Japan, Vol. 6 (2001), No. 1, p9~13). The application field of such functionally gradient material is quite wide, and various properties are expected for such materials.

An example of the functionally gradient material is a Cu core solder ball. Electronic appliances are required to be small size, lightweight and highly functional while having a high processing speed. A semiconductor package being small size and capable of being mounted in high density is required for complying with such requirements as described above. A BGA (Ball Grid Array) package has been particularly noticed as a plastic based package that is able to comply with multi-pin arrangement and easy packaging.

Solder balls as being spherical powder bodies are usually used for input-output terminals of the BGA package. Sn-37Pb eutectic solder balls and Sn-36Pb-2Ag solder balls containing a small amount of silver have been frequently used for the solder balls. However, hard-core balls that are able to precisely adjust the space between the BGA package and a printed circuit board have been urgently desired in recent years, and the copper core solder balls comprising copper cores on the surface of which the Sn-37Pb eutectic solder is plated have been developed. The copper core solder ball has good heat conductivity to permit the heat generated at semiconductor devices to be promptly transferred to the printed circuit board while being excellent in electrical conductivity.

SUMMARY OF THE INVENTION

However, it is currently impossible to stably and cheaply produce a material that is able to exhibit desired functions by variously changing the chemical composition and structure in the same material.

A small copper core solder ball having a diameter of 700 μm or less is required in recent years from a view point of further compacting the packages. However, the diameter of the solder ball capable of stable production is about 700 μm at best in the copper core solder ball on the surface of which a Sn-37Pb eutectic solder is plated by a plating method. By this producing method, it is difficult to further reduce the diameter of the solder ball. Moreover, forming a lead-free solder on the surface of the copper core solder ball is required in recent years considering the problem of environmental pollution.

The object of the present invention considering the situations above is to propose a material having a separated structure capable of properly controlling regions having different properties in the material in order that the core portion has different characteristics from those in the surface portion, for example, and a method for producing the same.

Another object of the invention is to notice the solder ball as a spherical powder, and to propose the powder as the member, suitable for the BGA package solder ball having a separated structure, and a method for producing the same.

The present inventors have devised, for solving the problems above, to separately arrange regions having different compositions with each other, for example, at the core portion and surface portion, respectively, by using an alloy that separates into two phases having different compositions with each other in a liquid state as shown in FIG. 1. Cu—Fe alloys and Cu—Co alloys are known as the alloy that separates into two phases in liquid state, (for example, Y. Nakagawa, ACTA METALLURGICA, Vol. 6 (1958), p. 704-711). However, since these alloys separates into metastable two phases in a liquid state so a stably separated structure cannot be obtained. The present inventors found, through further studies, that satisfying the following conditions is essential in order to stably obtain a member having a separated structure in which regions having different compositions with each other are disposed at two separated portions, for example, at a core portion and surface portion, respectively:

(1) to use an alloy that stably separates into two phases in a liquid state;

(2) to use an alloy having a two phase separation region in a liquid state in a wide temperature range;

(3) to increase the casting temperature from the liquid phase; and (4) to allow the alloy composition to have a volume fraction difference of 5% by volume or more between the two liquid phases.

Accordingly, the present inventors have noticed a Cu—Fe alloy, Cu—Cr alloy and Cu—Co alloy, and have studied factors that affect for forming a stable two phase separation state in the liquid phase. As a result, the present inventors found that adding a third element (X), which includes the selection of the kind and content of the element, is important for forming stable two phase separation in the liquid state. It was also confirmed that containing prescribed contents of one or more elements selected from C, Mo, Nb, V, Cr, W, Si, B, S, Ta, Bi, Ag and Sn as the element X in the Cu—Fe alloy is effective. It was also found that containing prescribed contents of one or more elements selected from Fe, C, Mo, Nb, S, B, V, W, Si, Sn, Ta, Ag and Co as the element X in the Cu—Cr alloy is effective and that containing prescribed contents of one or more elements selected from Fe, C, Mo, Nb, S, B, V, W, Si, Sn, Ta, Ag and Cr as the element X in the Cu—Co alloy is effective.

The present inventors also noticed that a powder, as a member, having a separated structure, may be applied for a BGA package solder ball. The present inventors have noticed a Cu—Bi alloy and an Al—Sn alloy, for forming a separated structure in a powder, of which the surface portion has a lead free solder composition and the inner portion has the composition being excellent in electrical conductivity and high heat conductivity, and studied the factors affecting for forming a stable two phase separation in the liquid state. Consequently, it was found that adding a third element (X) including as well as selecting the kind and content of the element is important for forming a stable two phase separation in the liquid state. It was further confirmed that containing prescribed contents of Sn, In, Ag, Sb, Zn, Al, Bi, Cu and Ni as the element X in the Cu—Bi alloy and Al—Sn alloy is effective.

The present invention has been completed through further studies based on the discoveries above.

Specially, the gist of the invention are as follows:

(1) A member comprising an alloy having a separated structure consisting of two regions having different compositions with each other;

(2) The member having a separated structure according to (1) consisting the alloy exhibiting two phase separation in liquid state separating into two liquid phases having different compositions with each other, wherein a temperature difference $\Delta T$ between the maximum temperature Tc and a minimum temperature Td of a region exhibiting two phase separation in the liquid state is 10° C. or more;

(3) The member having a separated structure according to (1) or (2), wherein the alloy has a mean composition that allows the difference of volume fractions of the two liquid phases having different compositions with each other to be 5% by volume or more;

(4) The member according to any one of (1) to (3), wherein the member is a powder having a separated structure obtained by spray-quenching the molten alloy;

(5) A part obtained by molding, or by molding and additional sintering, using the powder member according to (4);

(6) The member having a separated structure according to any one of (1) to (4), wherein the alloy is any one of a Cu—Fe—X alloy, a Cu—Cr—X alloy or a Cu—Co—X alloy;

(7) The member having a separated structure according to (6), wherein the Cu—Fe—X alloy comprises 15 to 85% by mass of Fe and X being one or more elements selected from a group consisting of 0.02 to 2.0% of C, 2 to 20% of Mo, 2 to 20% of Nb, 4 to 20% of V, 4 to 30% of Cr, 2 to 20% of W, 4 to 20% of Si, 0.2 to 10% of B, 0.2 to 10% of S, 2 to 20% of Ta, 1 to 20% of Bi, 2 to 20% of Ag and 2 to 20% of Sn each being represented by % by mass;

(8) The member having a separated structure according to (6), wherein the Cu—Cr—X alloy comprises 15 to 85% by mass of Cr and X being one or more elements selected from a group consisting of 4 to 20% of Fe, 0.02 to 2.0% of C, 2 to 20% of Mo, 2 to 20% of Nb, 0.2 to 10% of S, 0.2 to 10% of B, 4 to 20% of V, 2 to 20% of W, 4 to 20% of Si, 2 to 20% of Sn, 2 to 20% of Ta, 2 to 20% of Ag and 2 to 20% of Co each being represented by % by mass;

(9) The member having a separated structure according to (6), wherein the Cu—Co—X alloy comprises 15 to 85% by mass of Co and X being one or more elements selected from a group consisting of 4 to 20% of Fe, 0.02 to 2.0% of C, 2 to 20% of Mo, 2 to 20% of Nb, 0.2 to 10% of S, 0.2 to 10% of B, 4 to 20% of V, 2 to 20% of W, 4 to 20% of Si, 2 to 20% of Sn, 2 to 20% of Ta, 2 to 20% of Ag and 2 to 20% of Cr each being represented by % by mass;

(10) The member having a separated structure according to any one of (1) to (3), wherein the member is any one of a rod, wire and plate shape;

(11) The member having a separated structure according to any one of (1) to (4), comprising a ceramic in place of the alloy;

(12) A method for producing a member having a separated structure, comprising a step of casting a molten alloy into a prescribed shape at a temperature of Tc+10° C. or more to form the separated structure consisting of two regions having different compositions with each other, wherein the molten alloy exhibits two phase separation in the liquid state to separate into two liquid phases having different compositions with each other, and has the temperature difference $\Delta T$ between the maximum temperature Tc (° C.) and the minimum temperature Td (° C.) of a region exhibiting two phase separation in the liquid state being 10° C. or more;

(13) The method for producing the member according to (12), wherein the alloy has a mean composition that allows the difference of the volume fraction between the two liquid phases to be 5% by volume or more;

(14) The method for producing the member according to (12) or (13), wherein said step is forming the molten alloy into a powder having a separated structure consisting of two regions having different compositions with each other by spray-quenching the molten alloy in place of a step of casting into a prescribed shape;

(15) The method for producing the member according to (12) or (13), wherein the prescribed shape is any one of a rod, a wire and a plate;

(16) The method for producing the member according to any one of (12) to (15), wherein the alloy is a Cu—Fe—X alloy, a Cu—Cr—X alloy or a Cu—Co—X alloy;

(17) The method for producing the member according to (16), wherein the Cu—Fe—X alloy comprises 15 to 85% by mass of Fe and X being one or more elements selected from a group consisting of 0.02 to 2.0% of C, 2 to 20% of Mo, 2 to 20% of Nb, 4 to 20% of V, 4 to 30% of Cr, 2 to 20% of W, 4 to 20% of Si, 0.2 to 10% of B, 0.2 to 10% of S, 2 to 20% of Ta, 1 to 20% of Bi, 2 to 20% of Ag and 2 to 20% of Sn each being represented by % by mass;

(18) The method for producing the member according to (16), wherein the Cu—Cr—X alloy comprises 15 to 85% by mass of Cr and X being selected from one or more elements selected from a group consisting of 4 to 20% of Fe, 0.02 to 2.0% of C, 2 to 20% of Mo, 2 to 20% of Nb, 0.2 to 10% of S, 0.2 to 10% of B, 4 to 20% of V, 2 to 20% of W, 4 to 20% of Si, 2 to 20% of Sn, 2 to 20% of Ta, 2 to 20% of Ag and 2 to 20% of Co each being represented by % by mass;

(19) The method for producing the structure according to (16), wherein the Cu—Co—X alloy comprises 15 to 85% by mass of Co and with X being one or more elements selected from a group consisting of 4 to 20% of Fe, 0.02 to 2.0% of C, 2 to 20% of Mo, 2 to 20% of Nb, 0.2 to 10% of S, 0.2 to 10% of B, 4 to 20% of V, 2 to 20% of W, 4 to 20% of Si, 2 to 20% of Sn, 2 to 20% of Ta, 2 to 20% of Ag and 2 to 20% of Cr each being represented by % by mass;

(20) The member according to (4), wherein the member is a solder ball, and the separated structure of the powder comprises a surface portion having a lead-free solder composition and a core portion having a composition being excellent in electrical conductivity and heat conductivity;

(21) The member according to (20), wherein the core portion has a composition mainly comprising Cu or Al.

(22) The member according to (20), wherein the alloy is any one of a Cu—Bi—X alloy, an Al—Sn—X alloy and an Al—In—X alloy;

(23) The member according to (22), wherein the Cu—Bi—X alloy comprises 5 to 70% by mass of Bi and X being one or more elements selected from a group consisting of 0.1 to 30% of Sn, 0.1 to 30% of In, 0.1 to 30% of Ag, 0.1 to 30% of Sb, 0.1 to 30% of Zn and 0.1 to 30% of Al each being represented by % by mass;

(24) The member according to (22), wherein the Al—Sn—X alloy comprises 5 to 90% by mass of Sn and X being one or more elements selected from a group consisting of 0.1 to 30% of Bi, 0.1 to 30% of In, 0.1 to 30% of Ag, 0.1 to 30% of Sb, 0.1 to 30% of Zn, 0.1 to 30% of Cu and 0.1 to 15% of Ni each being represented by % by mass;

(25) The member according to (22), wherein the Al—In—X alloy comprises 10 to 90% by mass of In and X being one or more elements selected from a group consisting of 0.1 to 30% of Sn, 0.1 to 30% of Bi, 0.1 to 30% of Cu, 0.1 to 30% of Ag, 0.1 to 30% of Sb, 0.1 to 30% of Zn, and 0.1 to 15% of Ni each being represented by % by mass;

(26) The method for producing the member according to (14), wherein the member is a solder ball, and the separated structure of the powder comprises a surface portion having a lead-free solder composition and a core portion having a composition being excellent in electrical conductivity and heat conductivity;

(27) The method for producing the member according to (26), wherein the core portion has a composition mainly comprising Cu or Al;

(28) The method for producing the member according to (26) or (27), wherein the powder has a mean particle diameter of 700 μm or less;

(29) The method for producing the member according to any one of (26) to (28), wherein the alloy is any one of a Cu—Bi—X alloy, an Al—Sn—X alloy and an Al—In—X alloy;

(30) The method for producing the member according to (29), wherein the Cu—Bi—X alloy comprises 5 to 70% by mass of Bi and X being one or more elements selected from a group consisting of 0.1 to 30% of Sn, 0.1 to 30% of In, 0.1 to 30% of Ag, 0.1 to 30% of Sb, 0.1 to 30% of Zn and 0.1 to 30% of Al each being represented by % by mass;

(31) The method for producing the member according to (29), wherein the Al—Sn—X alloy comprises 5 to 90% by mass of Sn and X being one or more elements selected from a group consisting of 0.1 to 30% of Bi, 0.1 to 30% of In, 0.1 to 30% of Ag, 0.1 to 30% of Sb, 0.1 to 30% of Zn, 0.1 to 30% of Cu and 0.1 to 15% of Ni each being represented by % by mass; and

(32) The method for producing the member according to (29), wherein the Al—In—X alloy comprises 10 to 90% by mass of In and X being one or more elements selected from a group consisting of 0.1 to 30% of Sn, 0.1 to 30% of Bi, 0.1 to 30% of Cu, 0.1 to 30% of Ag, 0.1 to 30% of Sb, 0.1 to 30% of Zn and 0.1 to 15% of Ni each being represented by % by mass.

DESCRIPTION OF THE INVENTION

The member of the present invention having a separated structure comprising an alloy, has a separated structure composed of two regions having different compositions with each other. The member of the present invention may be any one of a powder (a form of a powder), a rod, a wire, a plate and a pipe. It is needless to say that the member of the invention includes a members as cast, or a member prepared by further subjecting the as-cast member to forming, such as any one of a hot, warm or cold rolling or forging processing. A ceramic may be used in place of the alloy in the invention.

Figure 2:
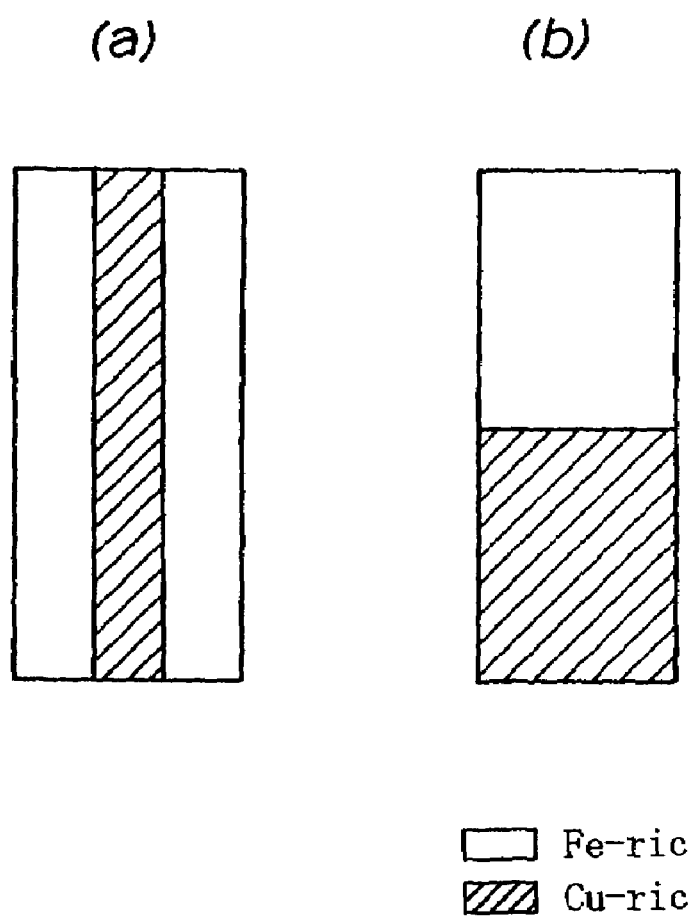
FIG. 2 shows schematic drawings illustrating structure configurations of the members.

FIG. 2 illustrates an example of the cross-sectional structure of a rod (rod member) made of the Cu—Fe—X alloy as an example of the member of the invention. The portions indicated by oblique lines correspond to Cu-rich phase regions, and the rest portions correspond to Fe-rich phase regions, showing that the member has a structure separated into two regions having different compositions with each other. In an example of a rod (round rod) shown in FIG. 2(a), the member has a structure separated into two regions having different compositions with each other, wherein the surface portion side is a Fe-rich phase region and the core portion is a Cu-rich phase region. The locations of the Fe-rich phase region and Cu-rich phase region may be reversed depending on production conditions.

In the example of the rod (round rod) shown in FIG. 2(b), the member has a structure separated into two regions having different compositions with each other in a vertical direction, wherein the lower layer side is a Cu-rich phase region and the upper layer side is a Fe-rich phase region. The structure of the Cu—Fe—X alloy powder is separated into two regions having different compositions with each other at the surface and at the core in on the particle, that is the Cu-rich region and the Fe-rich region, although the structure is not shown in the drawing.

Figure 1:
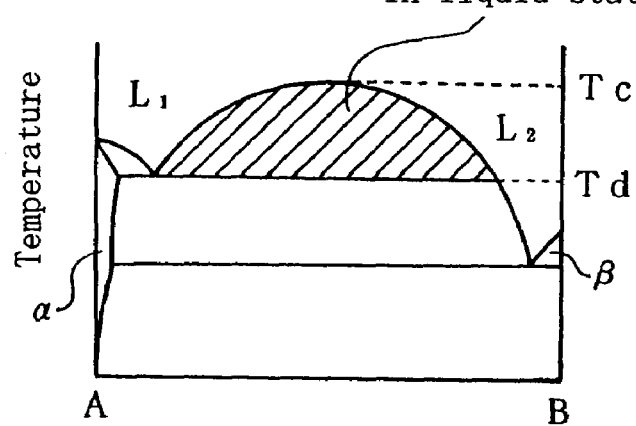
FIG. 1 shows schematic phase diagrams of an A-B alloy system suitable for producing the member of the present invention.
Figure 1:
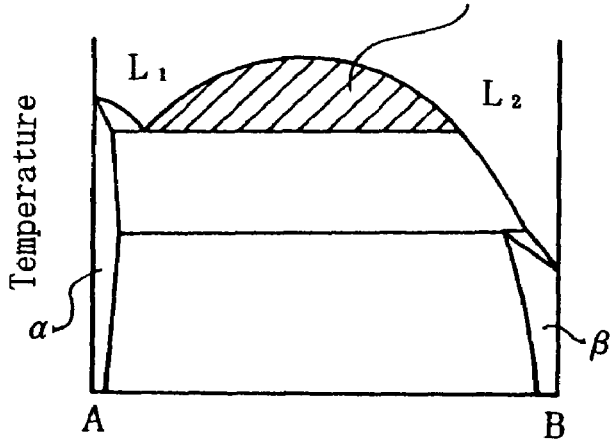

For forming the member having a separated structure as described above, the alloy used should be stably separated into two phases in the liquid state. Preferably, the alloy used, being stably separated into two phases in the liquid state, has a temperature difference ΔT of 10° C. or more, where ΔT is the difference between the maximum temperature Tc (° C.) and the minimum temperature Td (° C.) of the two liquid phase separation region. Tc and Td as used herein correspond to the maximum temperature and minimum temperature, respectively, in the region showing two liquid phase separation, as schematically illustrated in FIG. 1. The larger ΔT is, or the wider the two liquid phase separation temperature region is, the separated structure is readily obtained. When ΔT is less than 10° C., the phase separation temperature range is narrowed to afford insufficient two phase separation time during solidification, thereby hardly enabling the separated structure to be obtained.

Preferably, the alloy used in the invention, having the above stated stable two liquid phase separation, has a temperature difference ΔT of 10° C. or more between the maximum temperature Tc (° C.) and the minimum temperature Td (° C.) of the two liquid phase separation region, and further has a mean composition that afford a volume fraction difference of 5% or more between the separated two liquid phases.

Figure 3:
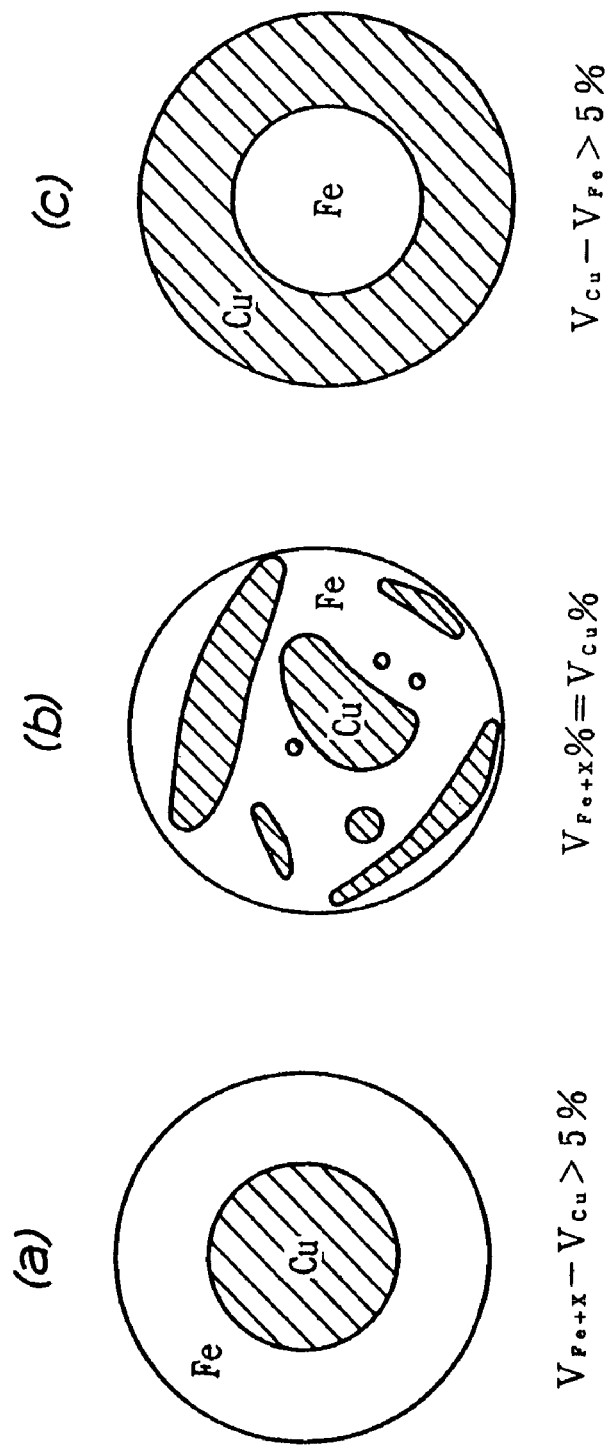
FIG. 3 shows schematic drawings illustrating changes of the structure configurations of the members depending on the difference of volume fraction between a Cu-rich phase and a Fe-rich phase.

FIG. 3 shows the effects of the volume fraction difference between the two liquid phases on forming a separated structure in an example of the Cu—Fe—X alloy, for example. Definitely separated structures are obtained in FIGS. 3(a) and 3(c), in which a difference between the volume fraction of the Cu-rich phase $V_{Cu}$ and the volume fraction of Fe-rich phase (Fe—X phase) $V_{Fe-X}$, $\Delta V_L = V_{Cu} - V_{Fe-X}$ or $V_{Fe-X} - V_{Cu}$, is 5% or more. Of the Cu-rich phase and the Fe-rich phase (Fe—X), the liquid phase having a larger volume fraction is disposed at the surface portion side, while the liquid phase having a smaller volume fraction is disposed at the core portion. On the other hand, when $\Delta V_L = 0$ the structure (composition) is not definitely separated between the core portion and surface portion as shown in FIG. 3(b). The volumes of the two liquid phases having different compositions with each other are calculated from phase diagrams.

As described above, the member of the invention is composed of a alloy having a composition system exhibiting a having stable two phase on separate in the liquid state, preferably having the two liquid separation region as described above. Or, the member is composed of an alloy having a composition (mean composition) as described above, and has a separated structure consisting of two regions having different compositions with each other.

Examples of the alloy that stably separates into two phases in the liquid state as described above include a Cu—Fe—X alloy, a Cu—Cr—X alloy, a Cu—Co—X alloy, an Ag—Ti—X alloy and an Al—Bi—X alloy. The alloys also include a Cu—Bi—X alloy, an Al—Sn—X alloy and an Al—In—X alloy that are suitable as solder balls.

The alloy systems that exhibit two phase liquid separation include a system that contains stable two phases in the liquid state, as well as a system having large two phase coexisting temperature and wide composition ranges between the solid phase and the liquid phase other than the alloys as described above. Examples of the alloy system are as follows:

Ag—B, Ag—Bi, Ag—Cr, Ag—Co, Ag—Fe, Ag—Mo, Ag—Ni, Ag—S, Ag—V, Al—Bi, Al—Cd, Al—In, Al—Pb, Al—Sn, Au—B, Ba—Ni, Ba—Y, Be—Ga, Be—Ge, Be—Zn, Bi—Cr, Bi—Cu, Bi—Ga, Bi—Ge, Bi—Si, Bi—Zn, Cd—Ge, Cd—Si, Co—In, Cr—Dy, Cr—Gd, Cr—La, Cr—Nd, Cr—Sn, Cr—Sm, Cr—Y, Cu—V, Fe—In, Fe—Sn, In—V, Nd—V, Ni—Pb, Sn—P, Pb—Si, Pb—Zn, Sb—S, Si—Zn, and Ti—Y alloy systems.

The Cu—Fe—X alloy can exhibit wide and stable two liquid phase separation by containing a prescribed quantity of one or more elements selected from C, Mo, Nb, V, Cr, W, Si, B, S, Ta, Bi, Ag and Sn as the third element X.

Preferably, the third element X in the Cu—Fe—X alloy comprises, in % by mass, one or more elements selected from 0.02 to 2.0% of C, 2 to 20% of Mo, 2 to 20% of Nb, 4 to 20% of V, 4 to 30% of Cr, 2 to 20% of W, 4 to 20% of Si, 0.2 to 10% of B, 0.2 to 10% of S, 2 to 20% of Ta, 1 to 20% of Bi, 2 to 20% of Ag and 2 to 20% of Sn. "% by mass" may be simply described as "%" hereinafter.

A stable two phase separation in the liquid state cannot be attained in the Cu—Fe—X alloy unless the content of the third element X is in the range as described above. When the content is out of the range above, the alloy cannot be definitely separated into two regions having different compositions with each other after solidification. Consequently, the separated structure is hardly formed, or the maximum temperature of the two liquid phase separation region becomes too high that the alloy cannot be hardly melted by conventional methods, failing in readily obtaining the separated structure.

The Cu—Fe—X alloy preferably contains 2 to 8% by mass of Ni as a fourth element in addition to the third element. Containing Ni as the fourth element in the range above does not give any influence in forming the separated structure. Instead, the element is effective for remarkably improving corrosion resistance, wear resistance and electrical conductivity in addition to lowering the melting point. Adding Ni as the fourth element is effective when excellent corrosion resistance, wear resistance and electrical conductivity are required.

Adding elements other than the elements described above is effective for improving other characteristics, although such elements such as Al for improving oxidation resistance not contribute for forming the separated structure. Accordingly, such fourth elements are also included in the range of the invention.

The Cu—Cr—X alloy can exhibit stable two liquid phase separation in a wide composition range, by adding one or more elements selected from a group consisting of 4 to 20% of Fe, 0.02 to 2.0% of C, 2 to 20% of Mo, 2 to 20% of Nb, 0.2 to 10% of S, 0.2 to 10% of B, 4 to 20% of V, 2 to 20% of W, 4 to 20% of Si, 2 to 20% of Sn, 2 to 20% of Ta, 2 to 20% of Ag, and 2 to 20% of Co as the third element X. A stable two liquid phase separation cannot be attained when the content of the third element X is out of the ranges described above to fail in definitely separating into two regions having different compositions with each other after solidification, thereby making it difficult to form a separated structure. Preferably, the content of Cr is in the range of 15 to 85% by mass depending on the content of the third element X with a balance of Cu and inevitable impurities.

The Cu—Co—X alloy becomes to exhibit stable two liquid phase separation in a wide composition range by containing, as the third element X, one or more elements selected from a group consisting of 4 to 20% of Fe, 0.02 to 2.0% of C, 2 to 20% of Mo, 2 to 20% of Nb, 0.2 to 10% of S, 0.2 to 10% of B, 4 to 20% of V, 2 to 20% of W, 4 to 20% of Si, 2 to 20% of Sn, 2 to 20% of Ta, 2 to 20% of Ag and 2 to 20% of Cr. Stable two liquid phase separation cannot be attained when the content of the third element X is out of the range described above to make it difficult to definitely separate into two regions having different compositions with each other after solidification, thereby making it difficult to form a separated structure. Preferably, the content of Co is in the range of 15 to 85% by mass depending on the content of the third element X with a balance of Cu and inevitable impurities.

A ceramic system exhibiting stable two phase separation in liquid state may be used in the invention in place of the alloys as described above. Examples of the ceramic system exhibiting stable two phase separation in the liquid state include $SnO_2$—$TiO_2$, $Al_2O_3$—$Cr_2O_3$, $Al_2O_3$—$Cr_2O_3$—$Fe_2O_3$, $CoFe_2O_3$—$Co_3O_4$, $SiO_2$—$Li_2O$, $SiO_2$—$Na_2O$ and $BaO$—$SiO_2$ systems.

As a member having a separated structure, a powder having an egg type core structure (referred to as an egg type structure) composed of a surface portion comprising a lead-free solder composition and a core portion having a composition being excellent in electrical conductivity and heat conductivity is preferably used as a solder ball. The term "solder composition" as used in the invention refers to as an alloy composition having a liquidus line temperature of 450° C. or less.

Figure 12:
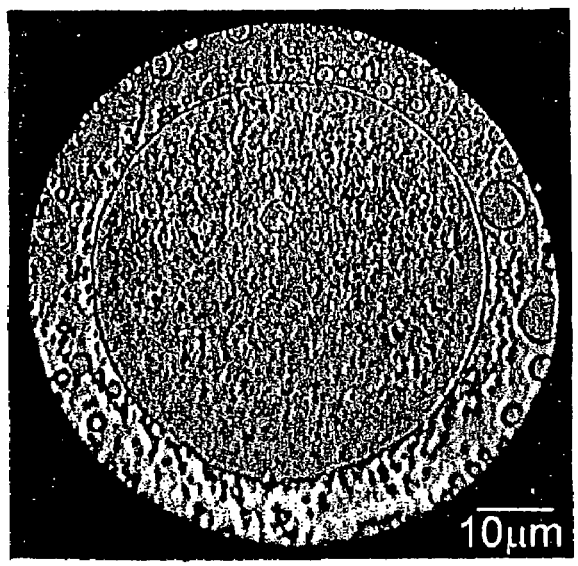
FIG. 12 shows, (a) a optical micrograph showing a cross sectional structure of a particle of the Cu—Bi—X alloy powder containing 35% by mass of Cu, 50% by mass of Bi and 15% by mass of Sn, and (b) is a sketch thereof.
Figure 12:
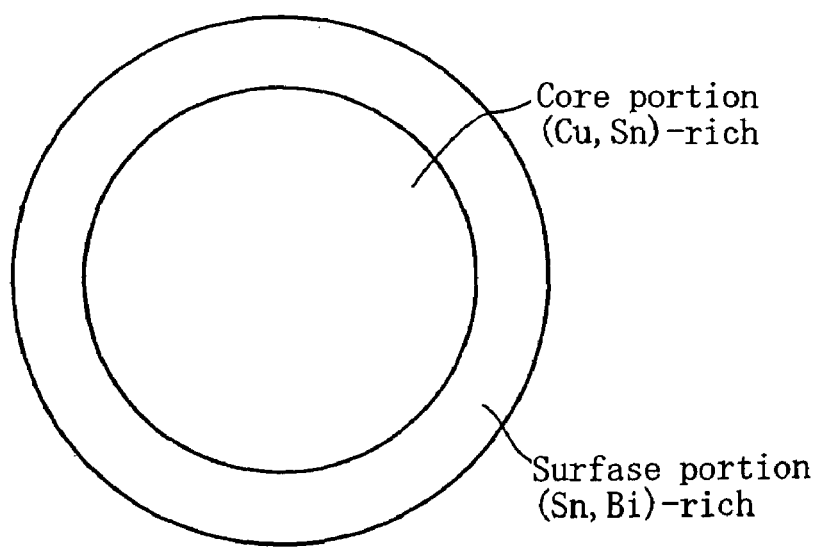

An example of the cross sectional structure of the solder ball of the present invention is shown in FIG. 12. The solder ball shown in FIG. 12 has the egg type core structure (also named as the core structure or egg type structure) having a composition of 35% by mass of Cu, 50% by mass of Bi and 15% by mass of Sn. The solder ball is a powder having a separated structure comprising a surface portion having a Sn- and Bi-rich solder composition (specifically, 9% by mass of Cu and 6% by mass of Sn with a balance of Bi) and a Cu- and Sn-rich core portion (specifically, 6% by mass of Bi and 13% by mass of Sn with a balance of Cu). The powder has a diameter of about 80 μm, or a diameter of as small as 700 μm or less.

For forming the powder (solder ball) having the separated structure, as in the above case, the alloy used should be stably separated into two phase in the liquid state with a temperature difference ΔT between the maximum temperature Tc (° C.) and the minimum temperature Td (° C.) of 10° C. or more in the two liquid phase separation region. And the alloy used also should have a mean composition such that the difference of the volume fraction between the separated two liquid phases is 5% or more, and should have a mean composition such that the surface portion of the powder comprises a lead-free solder composition and the core portion of the powder comprises a composition being excellent in electrical conductivity and heat conductivity. Preferably, the composition being excellent in electrical conductivity and heat conductivity is a composition mainly comprising Cu or Al.

Preferably, the alloy suitable for the solder ball is any one of the Cu—Bi—X alloy, the Al—Sn—X alloy and the Al—In—X alloy in the present invention.

The Cu—Bi—X alloy preferably contains, as the third element X in % by mass, one or more elements selected from 0.1 to 30% of Sn, 0.1 to 30% of In, 0.1 to 30% of Ag, 0.1 to 30% of Sb, 0.1 to 30% of Zn, and 0.1 to 30% of Al. The alloy having the composition above becomes to exhibit stable two liquid phase separation in a wide composition range. Preferably, the content of Bi is 5 to 70% by mass, and the content of Cu is 20 to 80% by mass depending on the content of the third element X as described above with a balance of inevitable impurities.

The composition above permits the surface portion to have a solder composition comprising 50 to 90% by mass of Bi and 1 to 30% by mass of X, and the core portion to have a composition excellent in electrical conductivity and heat conductivity comprising 80 to 99% by mass of Cu and 0.1 to 10% by mass of Bi. Stable two phase separation in the liquid state cannot be attained when the content of the third element X is out of the range described above, making the separated structure to be hardly formed after solidification or the surface portion to hardly have a solder composition.

The Al—Sn—X alloy preferably contains, as the third element X in % by mass, one or more elements selected from a group consisting of 0.1 to 30% of Bi, 0.1 to 30% of In, 0.1 to 30% of Ag, 0.1 to 30% of Sb, 0.1 to 30% of Zn, 0.1 to 30% of Cu, and 0.1 to 15% of Ni. The composition above permits the alloy to exhibit stable two phase separation in the liquid state in a wide composition range. Preferably, the content of Sn is in the range of 5 to 90% by mass, and the content of Al is in the range of 5 to 50% by mass depending on the content of the third element X as described above with a balance of inevitable impurities. The composition above permits the surface portion to have a solder composition comprising 20 to 95% by mass of Sn and 1 to 50% by mass of X, on the other hand, the core portion to have a composition comprising 80 to 99% by mass of Al and 1 to 20% by mass of Sn, which is excellent in electrical conductivity and heat conductivity. Stable two phase separation in the liquid state cannot be attained when the content of the third element X is out of the range described above, making the separated structure to be hardly formed after solidification or the surface portion to hardly have a solder composition.

The Al—In—X alloy preferably contains, as the third element X in % by mass, one or more elements selected from a group consisting of 0.1 to 30% of Sn, 0.1 to 30% of Bi, 0.1 to 30% of Cu, 0.1 to 30% of Ag, 0.1 to 30% of Sb, 0.1 to 30% of Zn, and 0.1 to 15% of Ni. The composition above permits the alloy to exhibit stable two phase separation in the liquid state in a wide composition range. Preferably, the content of In is in the range of 10 to 90% by mass, and the content of Al is in the range of 5 to 50% by mass depending on the content of the third element X as described above with a balance of inevitable impurities. The composition above permits the surface portion to have a solder composition comprising 20 to 95% by mass of In and 1 to 50% of X, on the other hand, the core portion to have a composition comprising 80 to 99% by mass of Al and 1 to 20% by mass of In, which is excellent in electrical conductivity and heat conductivity. Stable two phase separation in the liquid cannot be attained when the content of the third element X is out of the range described above, making the separated structure to be hardly formed after solidification or the surface portion to hardly have a solder composition.

The alloy systems as described above sufficiently satisfy the conditions for exhibiting stable two phase separation in the liquid state.

The method for producing the member having the separated structure as described above will be described hereinafter.

A molten liquid of an alloy exhibiting stable two phase separation in the liquid state, preferably which has a composition comprising two liquid phase separation regions with ΔT of 10° C. or more, or further has the composition (mean composition) to afford the volume fraction difference between the separated two liquid phases of 5% or more is produced. The method for producing the molten alloy is not particularly restricted, and any method known in the art for producing the molten alloy may be used.

The molten alloy is then cast into a mold having a prescribed shape and material. The casting temperature greatly influences on forming the separated structure in the present invention. The casting temperature is preferably Tc+10° C. or more. A separated structure definitely separated into two regions having different compositions with each other cannot be obtained when the casting temperature is less than Tc+10° C.

Figure 4:
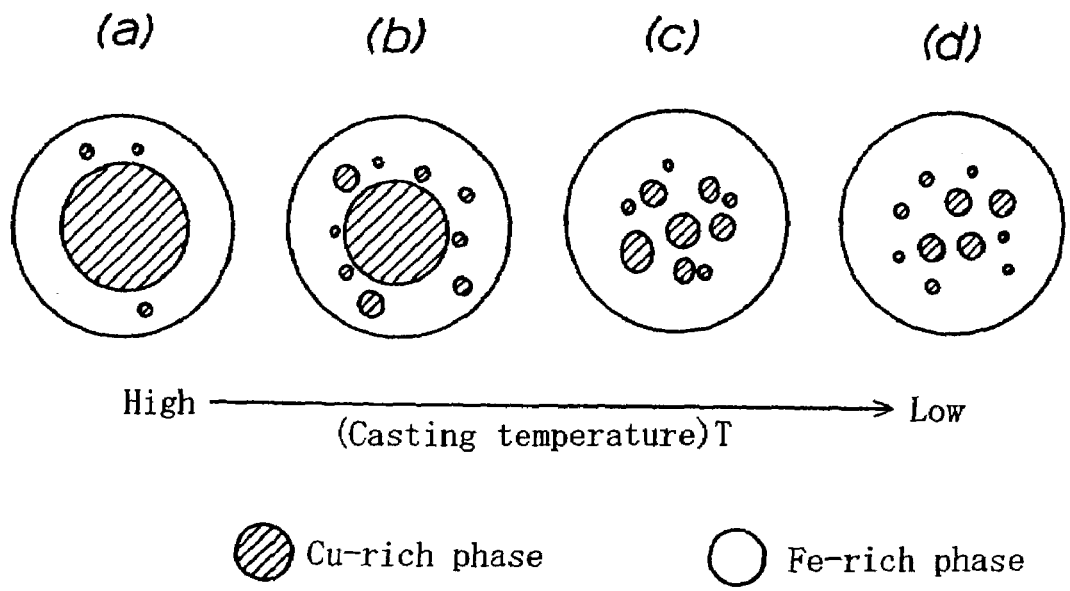
FIG. 4 shows schematic drawings illustrating the relations between structure configurations and casting temperatures of the Cu—Fe—X alloy members.
Figure 5:
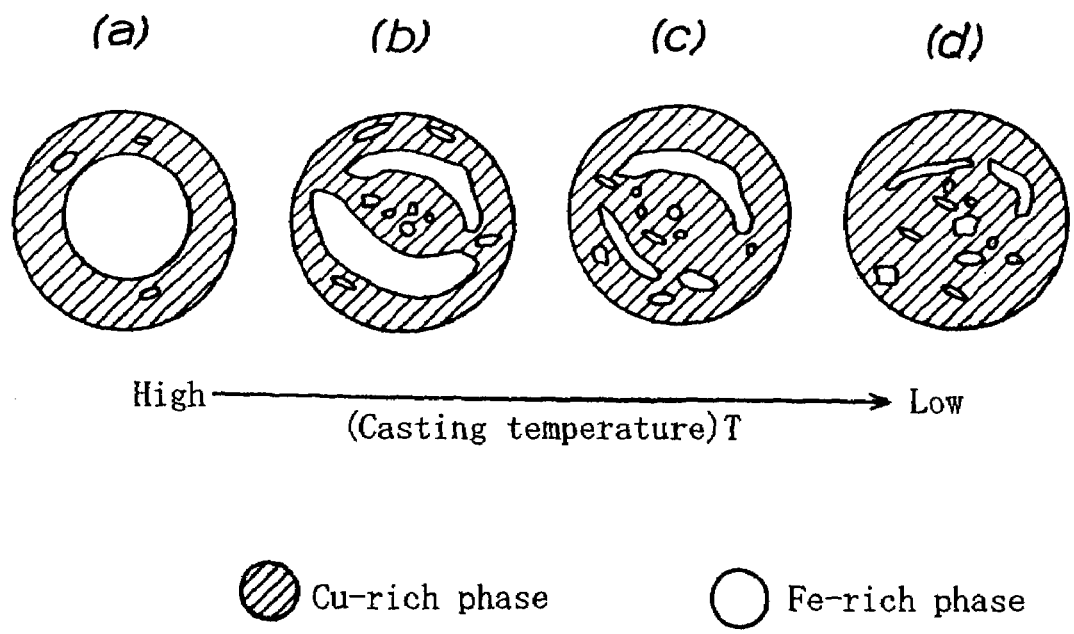
FIG. 5 shows schematic drawings illustrating the relations between structure configurations and casting temperatures of the Cu—Fe—X alloy members.

The effects of the casting temperature on forming such separated structure are schematically shown in FIGS. 4 and 5 using an example of Cu—Fe—X alloy. The Cu—Fe—X ternary molten alloy is formed in FIGS. 4 and 5, and columnar members (columns) were formed by casting the molten alloy into a metal mold at various casting temperatures. Macroscopic structures were observed with respect to cross sections of the columnar members (columns), and the results are schematically shown in the drawings. FIG. 4 corresponds to the case when the volume of the Fe-rich liquid phase is larger, while FIG. 5 corresponds to the case when the volume of the Cu-rich liquid phase is larger.

FIGS. 4 and 5 show that, although the Fe-rich phase is formed at the surface side of the columnar member (column) with the Cu-rich phase inside when the casting temperature is high ((a) and (b) ), the Fe-rich phase and Cu-rich phase are not definitely separated with each other as the casting temperature is lowered ((c) and (d)), showing that the Cu-rich phase is dispersed in the inside.

From the results above, in the present invention, the casting temperature is adjusted to be Tc+10° C. or more with reference to the maximum temperature Tc (° C.) in the two liquid phase separation region. The separated structure is insufficiently formed at a temperature of less than Tc+10° C.

When a casting mold made by a material exhibiting a relatively slow cooling rate for solidification, for example, a graphite crucible is used as a mold for casting the molten alloy in the invention, a separated structure in which the Cu-rich phase and Fe-rich phase are vertically separated with each other is obtained as shown in FIG. 2(*b*) in any of the compositions above by casting the molten Cu—Fe—X alloy into a mold for a rod-like shape. When a casting mold made by a material exhibiting a high cooling rate for solidification, for example a metal mold, is used, on the other hand, a separated structure having a Fe-rich phase at the surface side of the member and a Cu-rich phase inside (or vice versa) is obtained as shown in FIG. 2(*a*). Since the configuration of the separated structure is different depending on the material of the casting mold, or depending on the cooling rate for solidification, the material of the casting mold should be properly selected.

Fine powder particles having the separated structure, which is separated into two structure having different compositions with each other at the surface portion and at the core portion as in the rod-like member and the wire members, may be readily produced in the invention by converting the molten alloy prepared to have the composition in the range as described above into a powder member (powder) by using an atomizing method. Atomizing method is a kind of method producing powder, in which molten alloy is spray quenched and made to fine powder. Atomizing method has several varieties of water atomizing, gas atomizing, vacuum atomizing, and so on, and each of these are used for a mass production of the powder. While these methods can be favorably used for producing the member (powder) of the invention, the invention is by no means restricted to the methods as described above.

The powder is obtained by spray-quenching the molten alloy by using a water jet in the water atomizing method, while in the gas atomizing method the molten alloy is sprayed using a high pressure $N_2$ or Ar gas in place of water.

A fine powder produced by the atomizing method in which a molten alloy is spray-quenched usually has a mean particle diameter in the range of 100 to 500 μm or less, and especially a fine powder with a mean particle diameter of 300 μm or less can be obtained by selecting the kind of the gas, by controlling the spray pressure of the gas, and by adjusting the nozzle hole diameter. For example, it is preferable for forming the fine powder to use a gas having a small atomic (molecular) weight such as $N_2$ gas and He gas with a higher gas pressure and a smaller nozzle hole diameter. When the particle diameter is required to be less irregular as required in the solder ball for the BGA package, the powder is classified to have a prescribed range of particle diameter using a kind of sieve.

Figure 6:
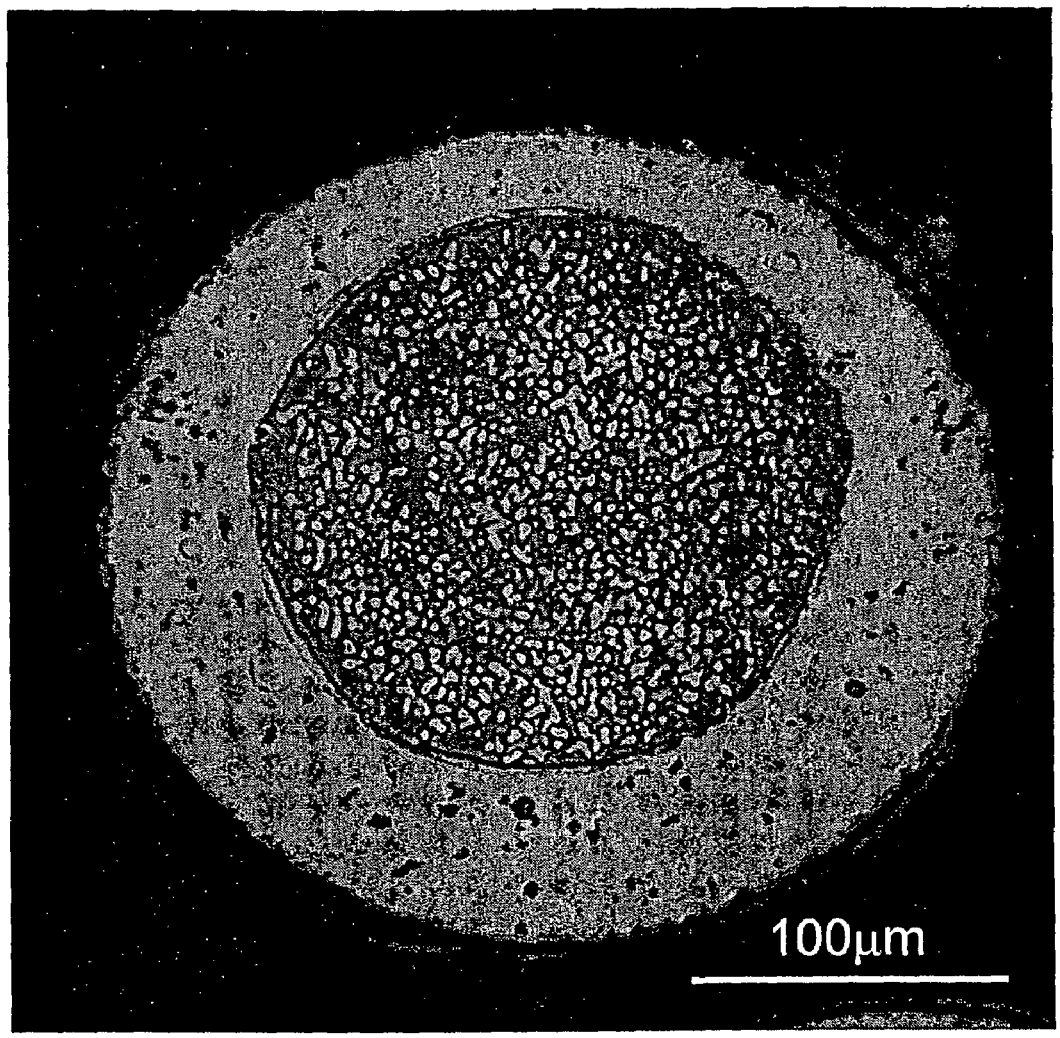
FIG. 6 is a optical micrograph showing a cross sectional structure of a particle of the Cu—Fe—X alloy powder containing 60% by mass of Cu, 31.8% by mass of Fe, 7.2% by mass of Cr and 1% by mass of C.

FIG. 6 shows an example of the cross sectional structure of a powder particle having a separated structure. The powder particle shown in FIG. 6 has a mean particle diameter of about 250 μm, and is obtained by spray-quenching the molten Cu—Fe—X alloy, which has a composition of 60% of Cu, 31.8% of Fe, 7.2% of Cr and 1% of C each in % by mass, by using the gas atomizing method. The powder particle has a structure definitely separated into two regions—Fe-rich phase at the surface side and Cu-rich phase at the core portion—having different compositions with each other.

Figure 7:
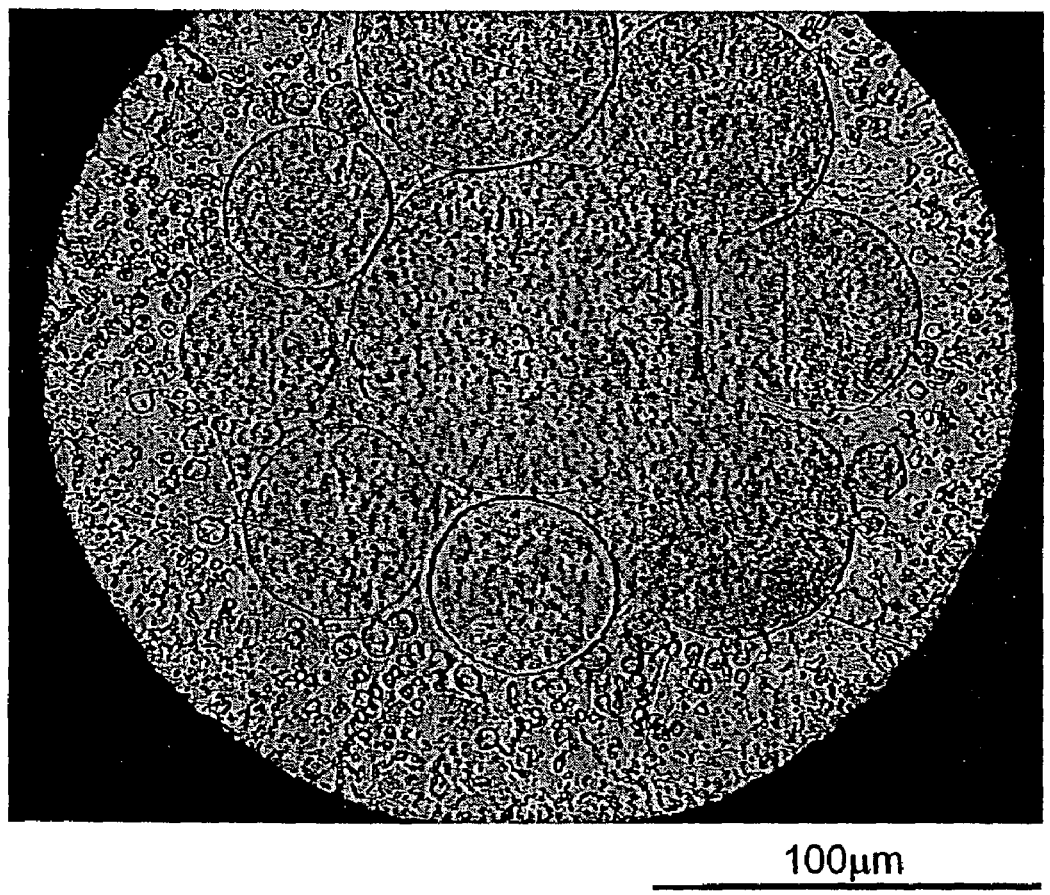
FIG. 7 is a optical micrograph showing a cross sectional structure of a particle of the Cu—Fe—X alloy powder containing 60% by mass of Cu, 32% by mass of Fe and 8% by mass of Si.

FIG. 7 shows a optional micrograph of the cross sectional structure of a powder particle obtained by spray-quenching the molten Cu—Fe—X alloy having a composition of 60% of Cu, 32% of Fe and 8% of Si each in % by mass by using the gas atomizing method. The powder particle has a structure definitely separated into two regions—Cu-rich phase at the surface side and Fe-rich phase at the core portion—having different compositions with each other.

The powder material (powder) having such separated structure can be readily manufactured according to the present invention. A powder may be used for a sintering accelerating agent by forming the powder so that, for example, the Cu-rich phase is disposed at the surface portion side and the Fe-rich phase is disposed at the core portion side. It is also possible to use the powder as a high strength electrically conductive material by sintering the powder in which the surface portion side comprises a composition such as a Cu-rich phase having high electrical conductivity while the core side comprising a Fe-rich phase, for example.

A powder material (powder) having such separated structure has a quite wide application range by selecting the alloy systems. While the powder as it may be used as the BGA package ball as described above, the powder may be formed into an article (product) having a desired shape by compression molding by filling it into a die having a prescribed shape followed by sintering, if necessary. The product may be machined into various shape, if necessary, after sintering.

EXAMPLE

Example 1

The Cu—Fe—X ternary alloy having the composition shown in Table 1 was melted in an arc melting furnace, and the molten alloy was cast into a die under the conditions shown in Table 1 to solidify the molten alloy into a rod-like member (20 mm in diameter). The cast structure of the cross section of the member obtained was observed to investigate the separated structure formed.

The maximum temperature Tc of the two liquid phase separation region of the alloy used, and the temperature difference $\Delta T$ between the maximum temperature and the minimum temperature were determined from an experimentally obtained phase diagram and a calculated phase diagram. They are shown in Table 1. The difference of the volume fraction $\Delta V$ between two liquid phases having different compositions with each other in two liquid phase separation state of the alloy used was determined by calculation from the phase diagram, and the results are also shown in Tables 1 and 2.

TABLE 1

| Member No. | Molten alloy composition (% by mass) | | | Two phase separation in liquid phase | | | | Casting temperature ° C. | Mold used Kind | Structure after casting** | Note |
|---|---|---|---|---|---|---|---|---|---|---|---|
| | Cu | Fe | X | Yes/No | Tc° C. | $\Delta T$° C. | $\Delta V$* % | | | | |
| 1-1 | 50 | 50 | — | No | — | — | — | 1450 | Die | B-1 | Comparative example |
| 1-2 | 48 | 48 | Ni: 4 | No | — | — | — | 1450 | | B-1 | Comparative example |
| 1-3 | 48 | 48 | Mn: 4 | No | — | — | — | 1450 | | B-1 | Comparative example |
| 1-4 | 48 | 48 | Ni: 4 | No | — | — | — | 1450 | | B-1 | Comparative example |
| 1-5 | 48 | 48 | Co: 4 | No | — | — | — | 1450 | | B-1 | Comparative example |
| 1-6 | 48 | 48 | Al: 4 | No | — | — | — | 1450 | | B-1 | Comparative example |
| 1-7 | 49.5 | 49.5 | Cr: 1 | No | — | — | — | 1450 | | B-1 | Comparative example |
| 1-8 | 49 | 49 | Cr: 2 | No | — | — | — | 1450 | | B-1 | Comparative example |
| 1-9 | 48 | 48 | Cr: 4 | Yes | 1430 | 60 | 6 | 1460 | | A-2*** | Example of the invention |
| 1-10 | 48 | 48 | Cr: 6 | Yes | 1430 | 60 | 10 | 1460 | | A-2*** | Example of the invention |
| 1-11 | 60 | 34 | Cr: 6 | Yes | 1430 | 60 | 20 | 1460 | | A-1*** | Example of the invention |
| 1-12 | 46.4 | 46.4 | Cr: 7.2 | Yes | 1430 | 80 | 25 | 1460 | | A-2*** | Example of the invention |
| 1-13 | 65 | 27.8 | Cr: 7.2 | Yes | 1450 | 100 | 20 | 1480 | | A-1*** | Example of the invention |
| 1-14 | 49.5 | 49.5 | Mo: 1 | No | — | — | — | 1480 | | B-1 | Comparative example |
| 1-15 | 48 | 48 | Mo: 4 | Yes | 1730 | 300 | 6 | 1780 | | A-2*** | Example of the invention |
| 1-16 | 65 | 27.5 | Mo: 7.8 | Yes | 1950 | 500 | 25 | −2000 | **** | A-1*** | Example of the invention |
| 1-17 | 49 | 49 | Si: 2 | No | — | — | — | 1480 | | B-1 | Comparative example |
| 1-19 | 48 | 48 | Si: 4 | Yes | 1600 | 280 | 6 | 1620 | | A-2*** | Example of the invention |
| 1-20 | 44 | 44 | Si: 12 | Yes | 1580 | 300 | 15 | 1610 | | A-2*** | Example of the invention |
| 1-21 | 60 | 34 | Si: 6 | Yes | 1550 | 280 | 8 | 1590 | | A-1*** | Example of the invention |

Figure 8:
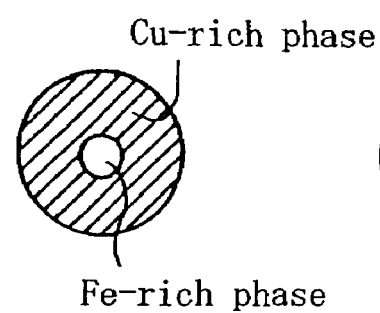
FIG. 8 illustrates classifications of the structure configurations of the members.
Figure 8:
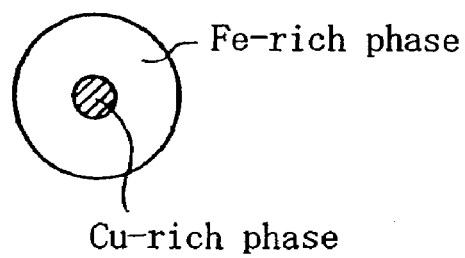
Figure 8:
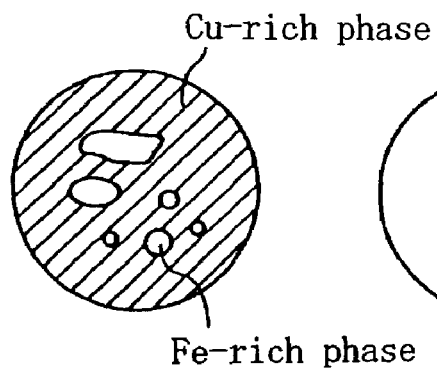
Figure 8:
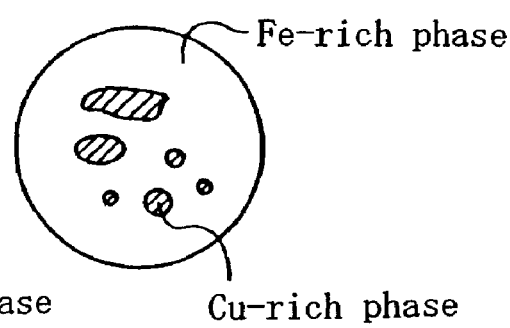

*Difference of volume fraction between two liquid phase = $(V_{Fe-X} - V_{Cu})$ or $(V_{Cu} - V_{Fe-X})$
**See FIG. 8
***A-1, A-2: Separated structure
****Arc melting: melted by generating arc at W-electrode

TABLE 2

| Member No. | Molten alloy composition (% by mass) | | | Two phase separation in liquid phase | | | | Structure temperature ° C. | Mold used Kind | Structure after casting** | Note |
|---|---|---|---|---|---|---|---|---|---|---|---|
| | Cu | Fe | X | Yes/No | Tc° C. | $\Delta T$° C. | $\Delta V$* % | | | | |
| 1-22 | 49.5 | 49.5 | V: 2 | No | — | — | — | 1550 | Die | B-1 | Comparative example |
| 1-23 | 48 | 48 | V: 4 | Yes | 1600 | 100 | 10 | 1620 | | A-2*** | Example of the invention |
| 1-24 | 70 | 26 | V: 4 | Yes | 1700 | 150 | 40 | 1750 | | A-1*** | Example of the invention |
| 1-25 | 49.5 | 49.5 | Nb: 1 | No | — | — | — | 1620 | | B-1 | Comparative example |
| 1-26 | 49 | 49 | Nb: 2 | Yes | 1500 | 100 | 6 | 1550 | | A-2*** | Example of the invention |
| 1-27 | 48 | 48 | Nb: 4 | Yes | 1550 | 200 | 10 | 1600 | | A-2*** | Example of the invention |
| 1-28 | 49.9 | 49.9 | C: 0.2 | Yes | 1750 | 400 | 5 | 1800 | | A-1*** | Example of the invention |
| 1-29 | 69.9 | 28 | Mo: 2, C: 0.1 | Yes | 2000 | 600 | 30 | −2100 | **** | A-1*** | Example of the invention |
| 1-30 | 60 | 39.6 | C: 0.4 | Yes | 1820 | 500 | 20 | −1950 | **** | A-1*** | Example of the invention |

*Difference of volume fraction between two liquid phase = $(V_{Fe-X} - V_{Cu})$ or $(V_{Cu} - V_{Fe-X})$
**See FIG. 8
***A-1, A-2: Separated structure
****Arc melting: melted by generating arc at W-electrode The results obtained are shown in Tables 1 and 2. The cast structure was evaluated according to schematically classified structure configurations as shown in FIG. 8. The Fe-rich phase and Cu-rich phase are definitely separated in the structure configurations A-1 and A-2, while the Fe-rich phase and the Cu-rich phase are not definitely separated in the structure configurations B-1 and B-2.

All the alloys in the examples of the invention have separated structures consisting of two regions having different compositions with each other, or a Cu-rich phase and a Fe-rich phase, at the surface portion side and core portion side. The Cu-rich phase is disposed at the surface portion side or at the core portion side depending on the composition (the phase occupying a larger volume of the liquid in two liquid phase separation state is disposed at the surface portion side).

In the comparative examples out of the range of the invention, no separated structure was observed since separation between the Fe-rich phase and the Cu-rich phase is insufficient.

Figure 9:
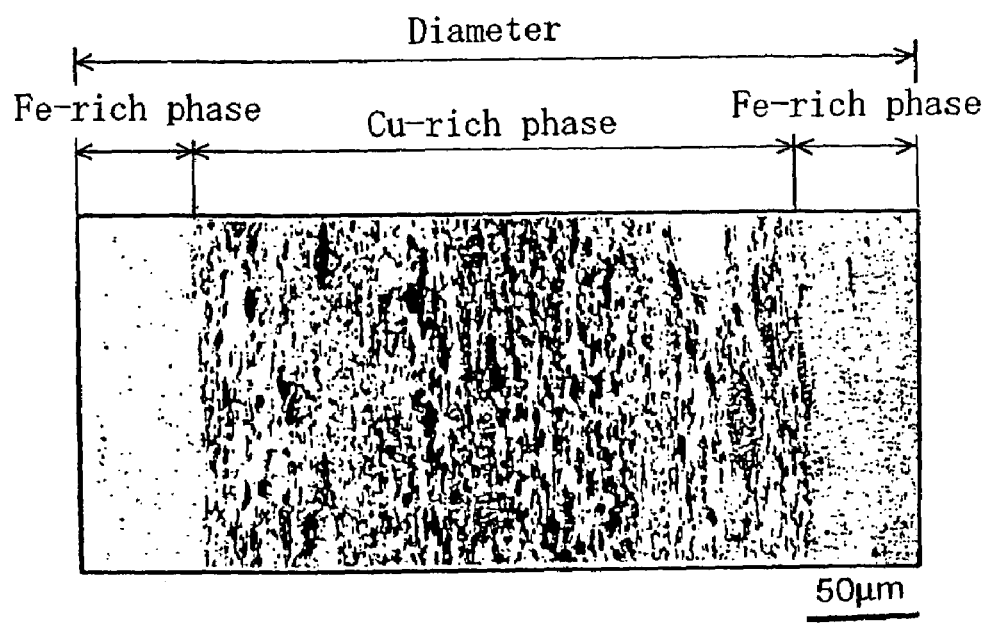
FIG. 9 is a optical micrograph showing a micro-structure of an example of the invention (member No. 1-24).
Figure 10:
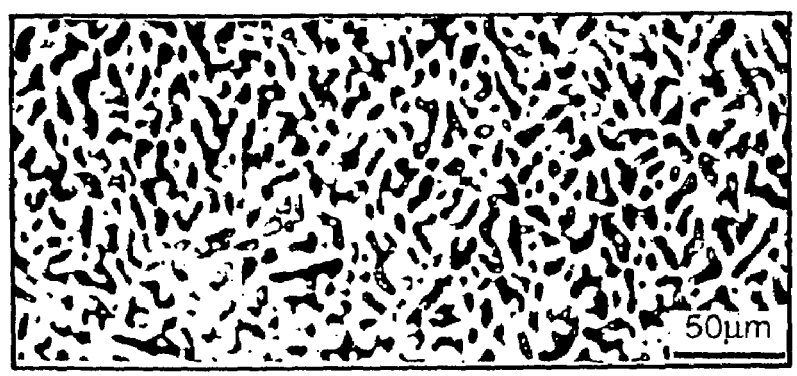
FIG. 10 is a optical micrograph showing the micro-structure of a comparative example (member No. 1-7).

The optical micrograph of the structure of member No. 1-24 as an example of the invention, and the optical micrograph of the structure of member No. 1-7 as a comparative example are shown in FIGS. 9 and 10, respectively.

The member comprising the Cu-rich phase (Cu alloy) at the surface portion side (outside) among the rod-like member (example of the invention) obtained is suitable as a high strength electrically conductive material and highly corrosion resistant material, since the Cu-rich phase (Cu alloy) has highly electrically conductive, highly corrosion resistant and highly heat radiating characteristics. On the other hand, the material comprising the Fe-rich phase (Fe alloy) at the surface portion side (outside) is suitable as a wear resistant material since the Fe-rich phase (Fe alloy) has high strength and high wear resistance.

The rod-like member obtained may be directly used as an article as casting, or after being subjected to a hot, warm or cold rolling and forging process.

Example 2

The Cu—Fe—X alloys ($X_1$: Cr, $X_2$: Ni, C) with the compositions shown in Table 3 were melted in an arc melting furnace, and were formed into rod-like members (20 mm in diameter) by casting the molten alloys into a casting mold to solidify under the conditions shown in Table 3. The cast structure of the cross section of the member obtained was observed, and the composition of each region after phase separation was analyzed by using an electron probe microanalyzer (EPMA). The cat structures were evaluated by the structure configuration schematically classified in FIG. 8 as in Example 1.

The results obtained are shown in Tables 3 and 4.

TABLE 4

| Member No. | Cu-rich phase (% by mass) | | | | Fe-rich phase | | | |
|---|---|---|---|---|---|---|---|---|
| | Cu | Fe | Cr | Ni | Cu | Fe | Cr | Ni |
| 2-1 | 96.9 | 2.7 | 0.4 | — | 5.8 | 77.3 | 17.0 | — |
| 2-2 | 97.7 | 2.1 | 0.3 | — | 2.2 | 78.2 | 19.6 | — |
| 2-3 | 97.1 | 2.5 | 0.4 | — | 7.3 | 74.5 | 19.6 | — |
| 2-4 | 95.0 | 2.9 | 0.7 | 1.4 | 8.8 | 69.3 | 16.8 | 5.2 |
| 2-5 | 95.9 | 1.6 | 0.2 | 2.3 | 10.4 | 64.5 | 17.6 | 7.6 |
| 2-6 | 93.4 | 3.5 | 0.9 | 2.2 | 8.7 | 65.4 | 18.5 | 7.4 |

All the alloys in the examples of the invention have separated structures consisting of two regions having different compositions with each other, or a Cu-rich phase and a Fe-rich phase, at the surface portion side and core portion side. In this alloy systems, the Fe-rich phase has a high content of Cr that is a stainless steel (high Cr)composition. Consequently, the member comprising the Fe-rich phase at the surface portion side (outside) is excellent in corrosion resistance at the surface portion while being excellent in electrical conductivity at the core portion. Particularly, corrosion resistance and electrical conductivity of the members No. 2-4, 2-5 and 2-6 containing Ni are remarkably improved.

Example 3

Figure 11:
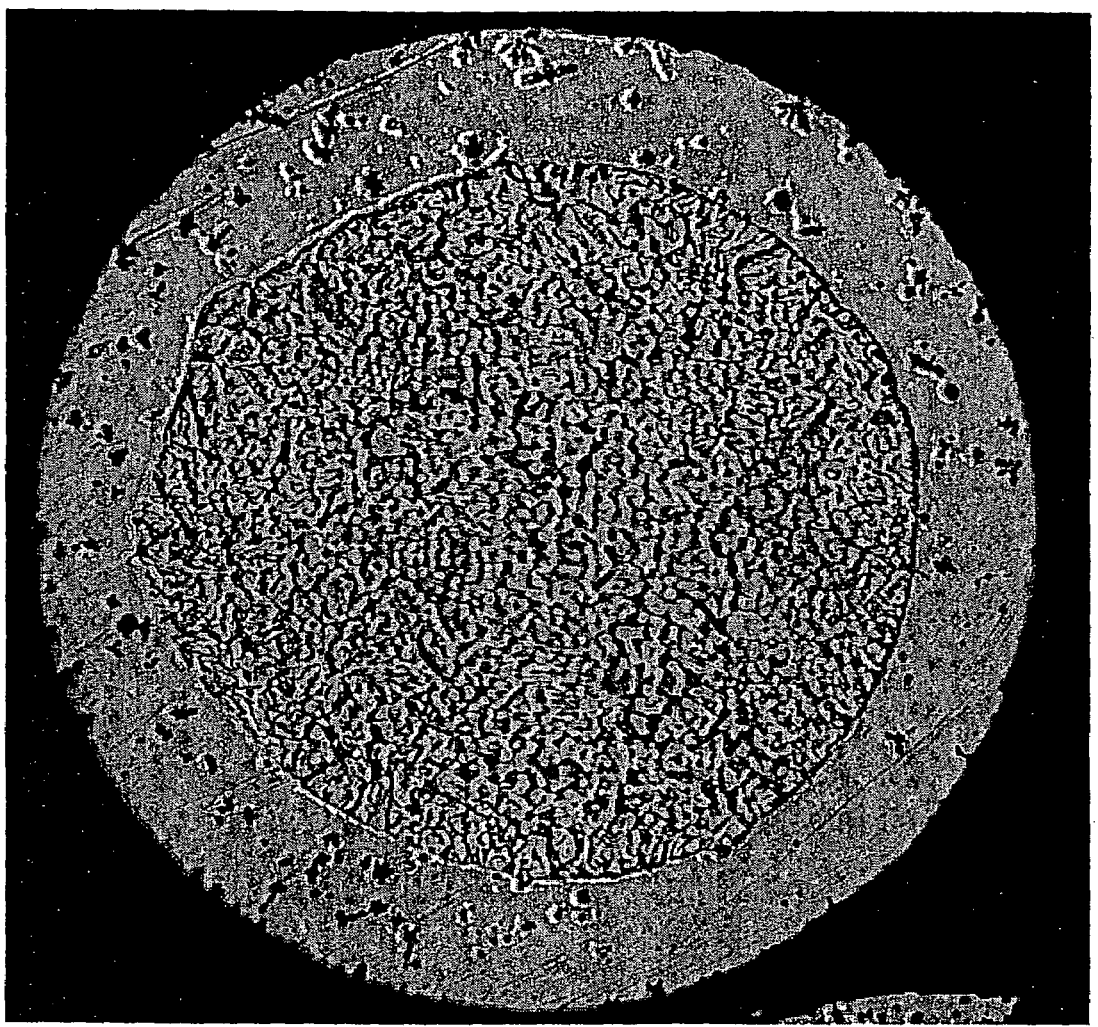
FIG. 11 is a optical micrograph showing a cross sectional structure of a particle of the Cu—Fe—X alloy powder containing 65% by mass of Cu, 31.4% by mass of Fe, 3% by mass of Si and 0.6% by mass of C.

The Cu—Fe—X alloy having a composition comprising 65% of Cu, 31.4% of Fe, 3% of Si and 0.6% of C in % by mass was melted in an arc furnace. The molten alloy was spray-quenched at a casting temperature of 1620° C. by the gas atomizing method to obtain a powder with a mean particle diameter of 300 μm or less. The alloy having this composition has Tc of 1590° C., ΔT of 270° C. and ΔV of 10%. The structure at the cross section (cross section of particles) of the member (powder) obtained was observed, which is shown in FIG. 11.

TABLE 3

| | Molten alloy composition (% by mass) | | | Two phase separation in liquid phase | | | | Casting temperature | Mold used | Structure after casting** | Note |
|---|---|---|---|---|---|---|---|---|---|---|---|
| Member No. | Cu | Fe | X | Yes/No | Tc° C. | ΔT° C. | ΔV*% | ° C. | Kind | | |
| 2-1 | 60 | 32.8 | Cr: 7.2 | Yes | 1450 | 100 | 20 | 1480 | Die | A-2*** | Example of the invention |
| 2-2 | 45 | 44 | Cr: 11 | Yes | 1480 | 110 | 25 | 1510 | Crucible | A-2*** | Example of the invention |
| 2-3 | 45 | 43.6 | Cr: 11, C: 0.4 | Yes | 2000 | 600 | 10 | ~-2100 | **** | A-2*** | Example of the invention |
| 2-4 | 60 | 29.6 | Cr: 7.2, Ni: 3.2 | Yes | 1430 | 100 | 20 | 1480 | Die | A-2*** | Example of the invention |
| 2-5 | 45 | 38.5 | Cr: 11, Ni: 5.5 | Yes | 1450 | 100 | 40 | 1550 | | A-2*** | Example of the invention |
| 2-6 | | | | Yes | 1450 | 100 | 40 | 1550 | Crucible | A-2*** | Example of the invention |

*Difference of volume fraction between two liquid phase = ($V_{Fe-X}$ − $V_{Cu}$) or ($V_{Cu}$ − $V_{Fe-X}$)
**See FIG. 7
***A-1, A-2: Separated structure
****Arc melting: melted by generating arc at W-electrode The powder obtained has a separated structure with definitely separated Cu-rich phase at the surface portion side and Fe-rich phase at the core portion side.

Example 4

The Cu—Bi—X alloys having the compositions shown in Table 5 were melted in an arc furnace. The casting temperature is as shown in Table 5, and the molten alloys were spray-quenched under the spray conditions adjusted as shown in Table 5 by the gas atomizing method to obtain respective powders. The structure at the cross section (cross section of particles) of the member (powder) obtained was observed with respect to the configuration of the separated structure (mean particle diameters of the powder and core). The composition of each separated region was also analyzed by using an electron probe microanalyzer (EPMA).

The results obtained are shown in Table 5.

Figure 13:
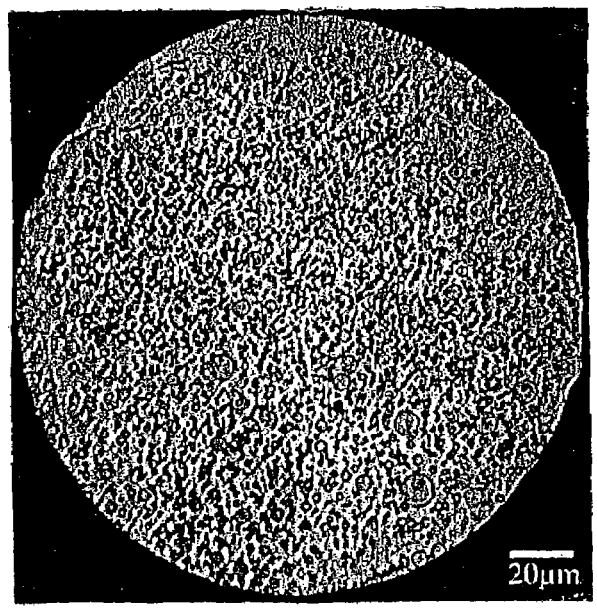
FIG. 13 is an optical micrograph showing a micro-structure of a comparative example (member No. 4-2).

The maximum temperature Tc of the two liquid phase separation region of the respective alloys, and the temperature difference ΔT between the maximum temperature and minimum temperature were determined from the experimental phase diagrams and the calculated phase diagrams. The difference of volume fraction ΔV between the two liquid phases having different compositions with each other in the two liquid phase separation state was also calculated from the phase diagram. These results are summarized in Table 5. The micro-structure of the example of the invention (powder No. 4-5) is as shown in FIG. 12. The micro-structure of the comparative example of the invention (powder No. 4-2) is shown in FIG. 13.

other hand, the powders in the comparative examples out of the range of the invention are insufficient in phase separation with no separated structures formed therein.

Example 5

The Al—Sn—X alloys having the compositions shown in Table 6 were melted in an arc furnace. The casting temperature was as shown in Table 6, and the molten alloys were spray-quenched under the spray conditions adjusted as shown in Table 6 by the gas atomizing method to obtain respective powder members (powders). The structure at the cross section (cross section of particles) of the member (powder) obtained was observed with respect to the configuration of the separated structure as the same Example 1. The composition of each portion was also analyzed by using an electron probe microanalyzer (EPMA).

The mean particle diameter of the powder obtained, and the mean diameter of the core were also measured by the same method as in Example 4.

TABLE 5

| Powder No. | Composition of molten alloy (% by mass) | | | Two phase separation in liquid phase | | | | Casting temperature °C. | Spray condition | | | Mean particle diameter μm |
|---|---|---|---|---|---|---|---|---|---|---|---|---|
| | Cu | Bi | X | Yes/No | Tc° C. | ΔT °C. | ΔV*% | | Gas spray pressure MPa | Nozzle diameter mm | Kind of gas | |
| 4-1 | 40 | 60 | — | No | — | — | — | 760 | 4 | 0.5 | Ar | 195 |
| 4-2 | 15 | 80 | Sn: 5 | No | — | — | — | 850 | 4 | 0.5 | Ar | 190 |
| 4-3 | 96 | 3 | In: 1 | No | — | — | — | 910 | 2 | 0.5 | Ar | 645 |
| 4-4 | 20 | 40 | Sn: 40 | No | — | — | — | 840 | 4 | 0.3 | Ar | 240 |
| 4-5 | 35 | 50 | Sn: 15 | Yes | 780 | 60 | 10 | 900 | 6 | 0.5 | $N_2$ | 80 |
| 4-6 | 20 | 60 | Sn: 20 | Yes | 750 | 40 | 30 | 860 | 4 | 0.5 | $N_2$ | 235 |
| 4-7 | 30 | 45 | In: 25 | Yes | 710 | 30 | 50 | 840 | 4 | 0.3 | Ar | 240 |
| 4-8 | 65 | 30 | Al: 5 | Yes | 810 | 110 | 12 | 950 | 4 | 0.5 | Ar | 372 |
| 4-9 | 30 | 55 | Sb: 15 | Yes | 640 | 140 | 30 | 860 | 4 | 0.5 | Ar | 300 |
| 4-10 | 25 | 55 | Zn: 20 | Yes | 710 | 26 | 35 | 820 | 2 | 0.5 | Ar | 462 |
| 4-11 | 70 | 20 | Zn: 10 | Yes | 730 | 15 | 60 | 810 | 4 | 0.3 | Ar | 196 |

| Powder No. | Separate structure Yes/No | Mean core diameter μm | Powder | | | | | | | | | | Note |
|---|---|---|---|---|---|---|---|---|---|---|---|---|---|
| | | | Mean content in surface portion (% by mass) | | | | | Mean content in core portion (% by mass) | | | | | |
| | | | Cu | Bi | Sn | In | X | Cu | Sn | Bi | In | X | |
| 4-1 | No | — | — | — | — | — | — | — | — | — | — | — | Comparative example |
| 4-2 | No | — | — | — | — | — | — | — | — | — | — | — | Comparative example |
| 4-3 | No | — | — | — | — | — | — | — | — | — | — | — | Comparative example |
| 4-4 | No | — | — | — | — | — | — | — | — | — | — | — | Comparative example |
| 4-5 | Yes | 53 | 9 | 85 | 6 | — | — | 81 | 6 | 13 | — | — | Example of the invention |
| 4-6 | Yes | 35 | 8 | 90 | 2 | — | — | 95 | 1 | 4 | — | — | Example of the invention |
| 4-7 | Yes | 48 | 7 | 58 | — | 35 | — | 93 | 1 | — | 7 | — | Example of the invention |
| 4-8 | Yes | 70 | 2 | 90 | — | — | Al: 8 | 91 | 5 | — | — | Al: 4 | Example of the invention |
| 4-9 | Yes | 39 | 6 | 73 | — | — | Sb: 21 | 89 | 2 | — | — | Sb: 9 | Example of the invention |
| 4-10 | Yes | 43 | 3 | 72 | — | — | Zn: 25 | 85 | 3 | — | — | Zn: 12 | Example of the invention |
| 4-11 | Yes | 55 | 10 | 80 | — | — | Zn: 10 | 88 | 2 | — | — | Zn: 10 | Example of the invention |

*Difference of volume fraction between two liquid phase = $(V_{Bi-X} - V_{Cu})$ or $(V_{Cu} - V_{Bi-X})$ The powders in all the examples of the invention above have lead-free solder compositions in the surface portions, while the core portions thereof have the compositions mainly comprising Cu and Sn, which are excellent in electrical conductivity and heat conductivity. The powders are as small as 700 μm or less in diameter having the separated structure, and are suitable as the solder ball. On the The results obtained are shown in Table 6.

Figure 14:
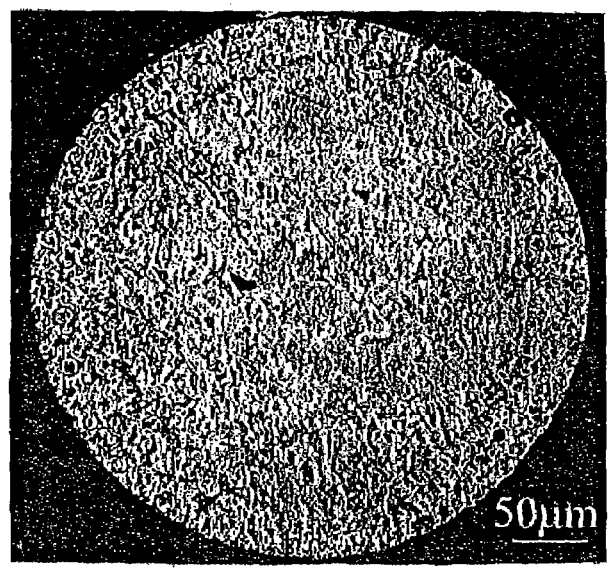
FIG. 14 is an optional micrograph showing a micro-structure an example of the invention (member No. 5-5).

The maximum temperature Tc, and the temperature difference ΔT between the maximum temperature and the minimum temperature were determined from the experimental phase diagrams and the calculated phase diagrams. Difference of volume fraction ΔV was also calculated from the phase diagram in Example 4. These results are summarized in Table 6. The micro-structure of the example of the invention (powder No. 5-5) is as shown in FIG. 14.

TABLE 6

| Powder No. | Composition of molten alloy (% by mass) | | | | Two phase separation in liquid state | | | | Casting temperature ° C. | Spray condition | | |
|---|---|---|---|---|---|---|---|---|---|---|---|---|
| | Al | Sn | In | X | Yes/No | Tc° C. | ΔT° C. | ΔV*% | | Gas spray pressure MPa | Nozzle diameter | Kind of gas |
| 5-1 | 20 | 80 | — | — | No | — | — | — | 850 | 4 | 0.5 | Ar |
| 5-2 | 39 | 10 | — | Bi: 51 | No | — | — | — | 900 | 4 | 0.4 | Ar |
| 5-3 | 85 | 10 | 8 | — | No | — | — | — | 887 | 4 | 0.5 | Ar |
| 5-4 | 20 | 0 | 80 | Tl: 5 | No | — | — | — | 912 | 2 | 0.8 | Ar |
| 5-5 | 29 | 61 | — | Cu: 11 | Yes | 605 | 30 | 70 | 700 | 3 | 0.5 | Ar |
| 5-6 | 30 | 37 | — | Bi: 33 | Yes | 580 | 80 | 20 | 720 | 4 | 0.4 | Ar |
| 5-7 | 19 | 75 | — | Nl: 6 | Yes | 631 | 45 | 63 | 765 | 3 | 0.5 | Ar |
| 5-8 | 48 | 13 | 39 | — | Yes | 810 | 210 | 34 | 910 | 3 | 0.5 | Ar |
| 5-9 | 15 | — | 80 | Cu: 6 | Yes | 603 | 88 | 71 | 800 | 4 | 0.5 | Ar |
| 5-10 | 21 | — | 64 | Bl: 15 | Yes | 595 | 148 | 56 | 875 | 2 | 0.6 | Ar |
| 5-11 | 35 | 18 | 35 | Zn: 12 | Yes | 645 | 185 | 40 | 920 | 2 | 0.7 | $N_2$ |

| Powder No. | Mean particle diameter μm | Separated structure Yes/No | Mean core diameter μm | Mean content in surface portion (% by mass) | | | | Mean content in core portion (% by mass) | | | | Note |
|---|---|---|---|---|---|---|---|---|---|---|---|---|
| | | | | Al | Sn | In | X | Al | Sn | In | X | |
| 5-1 | 210 | No | — | — | — | — | — | — | — | — | — | Comparative example |
| 5-2 | 383 | No | — | — | — | — | — | — | — | — | — | Comparative example |
| 5-3 | 231 | No | — | — | — | — | — | — | — | — | — | Comparative example |
| 5-4 | 680 | No | — | — | — | — | — | — | — | — | — | Comparative example |
| 5-5 | 390 | Yes | 35 | 2 | 88 | — | Cu: 17 | 97 | 2 | — | Cu: 1 | Example of the invention |
| 5-6 | 163 | Yes | 40 | 3 | 47 | — | Bl: 50 | 96 | 3 | — | Bi: 2 | Example of invention |
| 5-7 | 221 | Yes | 46 | 5 | 89 | — | N: 6 | 92 | 2 | — | Nl: 6 | Example of invention |
| 5-8 | 248 | Yes | 72 | 7 | 28 | 65 | — | 95 | 1 | 4 | — | Example of invention |
| 5-9 | 286 | Yes | 38 | 3 | — | 90 | Cu: 7 | 92 | — | 3 | Cu: 5 | Example of invention |
| 5-10 | 408 | Yes | 65 | 5 | — | 75 | Bl: 20 | 95 | — | 4 | Bi: 1 | Example of invention |
| 5-11 | 391 | Yes | 78 | 4 | 26 | 55 | Zn: 15 | 95 | 1 | 2 | Zn: 2 | Example of invention |

*Difference of volume fraction between two liquid phase = $(V_{Sn-X} - V_{Al})$ or $(V_{Al} - V_{Sn-X})$, $(V_{In-X} - V_{Al})$ or $(V_{Al} - V_{In-X})$ As in Example 4, the powders in all the examples of the invention above have lead-free solder compositions in the surface portions, while the core portions thereof have the compositions mainly comprising Al and Sn, which are excellent in electrical conductivity and heat conductivity. The powders are as small as 500 μm or less in diameter having the separated structures while having uniform and accurate particle diameter, which are suitable as the solder ball. On the other hand, the powders in the comparative examples out of the range of the invention are insufficient in phase separation with no separated structures formed therein.

It is needless to say that the invention is by no means restricted to the alloys as described above.

INDUSTRIAL APPLICABILITY

According to the invention, regions having different compositions with each other may be readily separated and disposed to enable functional members in which desired functions are properly combined and arranged to be readily and cheaply manufactured. Therefore, the invention is quite effective in industries. The invention also have an effect for readily obtaining composite materials with a low production cost while saving the resources, since an alloy abundant in expensive elements such as Cu and Cr, which are excellent in corrosion resistance, oxidation resistance and rear resistance, is formed at the surface portion side, while the core portion comprises a cheap alloy such as Fe in the inside. In the case of powder, on the other hand, the surface portion side comprises expensive elements such as Pd and Pt having catalytic properties while forming a cheap alloy composition at the core portion side, thereby enabling an inexpensive catalyst to be provided. Furthermore, a cheap powder having antibacterial property may be provided by forming the surface portion to have a composition exhibiting antibacterial property while forming the core portion side with a cheap material. Further, a cheap conductive powder may be provided by forming the surface portion side with a composition having highly conductivity such as Cu, and a powder having low expansion coefficient may be provided by forming the core portion with a composition having a low heat expansion coefficient comprising Cr, W, Mo and the like. Therefore, the member of the invention has a quite wide application range.

According to the invention, a powder having a separated structure can be cheaply produced with high dimensional accuracy by forming the surface portion with a lead-free solder composition while forming the inside (core portion) with a composition being excellent in electrical conductivity and heat conductivity. Consequently, a solder ball for the BGA package can be cheaply provided.

The invention claimed is:

1. Powder comprising particles of an alloy having a separated structure obtained by spray-quenching molten alloy and consisting of two regions having different compositions from each other, wherein one region is a core portion and one region is a surface portion surrounding the core portion and comprises a lead-free solder composition and the core portion has a composition excellent in electrical conductivity and heat conductivity wherein the alloy is a Cu—Bi—X alloy comprising 5 to 70% by mass of Bi and X being one or more elements selected from a group consisting of 0.1 to 30% of Sn, 0.1 to 30% of In, 0.1 to 30% of Ag, 0.1 to 30% of Sb, 0.1 to 30% of Zn and 0.1 to 30% of Al each being represented by % by mass.

2. A member comprising an alloy having a separated structure consisting of two regions having different compositions with each other, wherein the alloy is a Cu—Bi—X alloy comprising 5 to 70% by mass of Bi and X being one or more elements selected from a group consisting of 0.1 to 30% of Sn, 0.1 to 30% of In, 0.1 to 30% of Ag, 0.1 to 30% of Sb, 0.1 to 30% of Zn and 0.1 to 30% of Al each being represented by % by mass.

* * * * *